United States Patent
Lim

(10) Patent No.: US 7,068,075 B2
(45) Date of Patent: Jun. 27, 2006

(54) MULTI-LEVEL VOLTAGE OUTPUT CONTROL CIRCUIT AND LOGIC GATE THEREFOR

(75) Inventor: Dae-Ho Lim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/876,419

(22) Filed: Jun. 25, 2004

(65) Prior Publication Data

US 2005/0218932 A1   Oct. 6, 2005

(30) Foreign Application Priority Data

Mar. 31, 2004   (KR) .................... 10-2004-0022315

(51) Int. Cl.
  *H03K 19/094*   (2006.01)
(52) U.S. Cl. .............................. 326/68; 326/80; 326/81
(58) Field of Classification Search ............ 326/26–27, 326/80–83, 68; 327/108, 112
See application file for complete search history.

(56) References Cited

U.S. PATENT DOCUMENTS

| | | | | |
|---|---|---|---|---|
| 4,408,135 A | * | 10/1983 | Yuyama et al. | ................ 326/60 |
| 5,747,979 A | * | 5/1998 | Nagai | ........................ 323/349 |
| 6,133,748 A | * | 10/2000 | Ternullo, Jr. | .................. 326/21 |
| 6,826,096 B1 | * | 11/2004 | Pekny et al. | ........... 365/189.09 |

OTHER PUBLICATIONS

Sedra/Smith, Microelectronic Cirucits, 4th Ed. 1998, Translated Paper 2001, 2 pages, fig. 13.16 and 13.17, no month.

* cited by examiner

*Primary Examiner*—Anh Q. Tran
(74) *Attorney, Agent, or Firm*—Blakely Sokoloff Taylor & Zafman

(57) ABSTRACT

A multi-level voltage output control circuit selectively outputs one of multi-level power voltages by driving gates of two MOS transistors, which act as switching devices for the multi-level power voltages, with two output signals, the two output signals having complementary phases to each other and generated from two logic gates receiving two input signals which have an identical timing and complementary phases to each other, wherein the two logic gates advance or slow down a rising timing and/or a falling timing of the two output signals by differently adjusting a size of PMOS transistors and that of NMOS transistors, which construct the logic gates, thereby excluding a case in which the two output signals are in a same logic state at the same time.

20 Claims, 6 Drawing Sheets

WHEN IF, W'>W, L'>L

WHEN IF, V0>V1>V2>VSS

1. OVERLAPOING REGIONS OF SIGNALS N1 AND N2 GENRATED AT POINTS A AND C
2. OVERLAPOING REGIONS OF SIGNALS N3 AND N4 GENRATED AT POINTS B AND D

WHEN IF, W'>W, L'>L

WHEN IF, W'>W, L'>L

1. OVERLAPOING REGIONS OF SIGNALS N11 AND N22 GENRATED AT POINTS A' AND C'
2. OVERLAPOING REGIONS OF SIGNALS N33 AND N44 GENRATED AT POINTS B' AND D'

US 7,068,075 B2

MULTI-LEVEL VOLTAGE OUTPUT CONTROL CIRCUIT AND LOGIC GATE THEREFOR

FIELD OF THE INVENTION

The present invention relates to a driving circuit design technology; particularly to a circuit for driving low power in a portable display by removing a penetration current which may be generated at a driving circuit when selecting an output voltage at a multi-level voltage output terminal of a display such as a flat panel display.

DESCRIPTION OF RELATED ARTS

In FIG. 1, there is provided a multi-level voltage output control circuit used in a conventional circuit for driving a display such as LCD, PDP and so on.

The multi-level voltage output control circuit includes a multi-level voltage output terminal OUT and switching devices, e.g., transistors MP1, MP2, MN1 and MN2, for selecting a voltage to be outputted through the voltage output terminal OUT. Furthermore, a control unit for controlling the switching of the transistors MP1, MP2, MN1 and MN2 is a logic circuit of NAND gates and NOR gates as shown in FIG. 1.

The NAND gate NAND1 has one input node receiving an N5 signal and the other input node receiving a DATA signal. Meanwhile, the NAND gate NAND2 has one input node receiving the N5 signal and the other input node receiving a DATAb signal, which has an identical timing and complementary phase to the DATA signal. Therefore, output signals of the NAND gates NAND1 and NAND2 have complementary states to each other when the N5 signal has a high state. As a result, when the N5 signal has the high state, one of the switching transistors MP1 and MP2 is selectively driven.

FIG. 2 shows a timing diagram of signals at nodes of the circuit of FIG. 1, whose voltages are changing according to a state of an input signal.

As described in the lowest part of the timing diagram, it is noticed that edges of signals N1 and N2 are overlapped at points A and C and those of signals N3 and N4 are overlapped at points B and D.

That is, in the conventional circuit, there occurs a phase delay between a rising timing and a falling timing of each output signal according to the variation of voltage, temperature and so on, and, thus, identical level signals are overlapped at a certain time.

In this case, there exists a certain region in which a switching device of a low level voltage terminal, e.g., MP2, is turned-on before a switching device of a high level voltage terminal, e.g., MP1, is turned-off. As a result, a high level voltage, e.g., V0, among the multi-level voltages cannot be fully outputted through the output terminal OUT and there is generated a penetration current leaking to an input terminal of a low level voltage, e.g., V1.

In FIG. 2, the penetration current may be generated at the points A, B, C and D.

At the point A, if the signals N1 and N2 are overlapped and simultaneously have a low state for a while for certain reason, the transistor MP2 is turned-on before the transistor MP1 is turned-off. In this case, the high level voltage V0 of the multi-level voltages is not fully outputted through the output terminal OUT and flows to the low level voltage terminal V1, thereby producing the penetration current.

At the point B, if the signals N3 and N4 are overlapped and simultaneously have a high state for a while for certain reason, the transistors MP3 and MP4 are concurrently turned-on. At this moment, the high level voltage V2 is not fully outputted through the output terminal OUT and flows to a low level voltage terminal VSS, thereby generating the penetration current.

The same phenomenon can occur at the points C and D.

The penetration current increases power consumption and makes damage to the output performance and, sometimes, it can disable a device.

SUMMARY OF THE INVENTION

It is, therefore, an object of the present invention to provide a multi-level voltage output control circuit for removing the occurrence of a penetration current leaking to a low level voltage input terminal when a high level voltage is outputted.

In accordance with one aspect of the present invention, there is provided a multi-level voltage output control circuit for selectively outputting one of multi-level power voltages by driving gates of two PMOS transistors, which act as switching devices for the multi-level power voltages, with two output signals, wherein the two output signals have complementary phases to each other and generated from two NAND gates coupled with two input signals which have an identical timing and complementary phases to each other. The multi-level voltage output control circuit includes the two NAND gates for advancing a rising timing and slowing down a falling timing of the two output signals, thereby excluding a case in which the two output signals are in a same logic state at the same time, only by modulating sizes of PMOS transistors and NMOS transistors constructing the two NAND gates.

In the structure of the above NAND gate, it is preferable that a threshold voltage $V_T$ is lowered by modulating a channel width W or a channel length L of at least one of the PMOS transistors constituting the NAND gate. It is more preferable that the channel width W of the PMOS transistor is extended to lower the threshold voltage $V_T$.

In the other case, when constructing the above NAND gate, it is preferable that the threshold voltage $V_T$ is raised by adjusting a channel width W or a channel length L of the NMOS transistors constructing the NAND gate. It is more preferable that the channel length L of the NMOS transistors is lengthened to raise the threshold voltage $V_T$.

In accordance with another aspect of the present invention, there is provided a multi-level voltage output control circuit for selectively outputting one of multi-level power voltages by driving gates of two NMOS transistors, which act as switching devices for the multi-level power voltages, with two output signals, wherein the two output signals have complementary phases to each other and generated from two NOR gates coupled with two input signals which have an identical timing and complementary phases to each other. The multi-level voltage output control circuit includes the two NOR gates for slowing down a rising timing and advancing a falling timing of the two output signals, thereby excluding a case in which the two output signals are in a same logic state at the same time, by modulating sizes of PMOS transistors and NMOS transistors constructing the two NOR gates.

In the structure of the above NOR gate, it is preferable that a threshold voltage $V_T$ is raised by modulating a channel width W or a channel length L of the PMOS transistors constructing the NOR gate. It is more preferable that the channel length L of the PMOS transistor is lengthened to raise the threshold voltage $V_T$.

In the other case, when constituting the above NOR gate, it is preferable that the threshold voltage $V_T$ is lowered by adjusting a channel width W or a channel length L of at least one of the NMOS transistors constructing the NOR gate. It is more preferable that the channel width W of the NMOS transistor is widened to lower the threshold voltage $V_T$.

In accordance with further another aspect of the present invention, there is provided a NAND gate circuit for a multi-level voltage output control circuit including a first NAND gate receiving a first signal and a second NAND gate coupled with a second signal, which has an identical timing and a complementary phase to the first signal, thereby generating two output signals which have complementary phases to each other, wherein, for each of the first and the second NAND gate, at least one of PMOS transistors constituting the NAND gate has a channel width W relatively larger than its channel length L and NMOS transistors constructing the NAND gate have a channel length L relatively larger than their channel width W.

In accordance with further another aspect of the present invention, there is provided a NOR gate circuit for a multi-level voltage output control circuit including a first NOR gate coupled with a first signal and a second NOR gate receiving a second signal, which has an identical timing and a complementary phase to the first signal, thereby producing two output signals which have complementary phases to each other, wherein, for each of the first and the second NOR gate, PMOS transistors constituting the NOR gate have a channel width W relatively shorter than their channel length L and at least one of NMOS transistors constructing the NOR gate has a channel length L relatively shorter than its channel width W.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, the construction and operation of the present invention will be explained in detail.

Figure 3A:
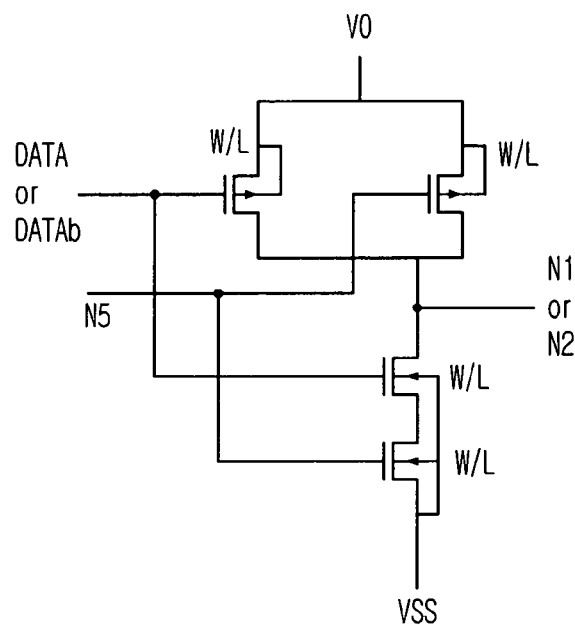
FIG. 3A shows the construction of a conventional NAND gate included in the circuit in FIG. 1.
Figure 3B:
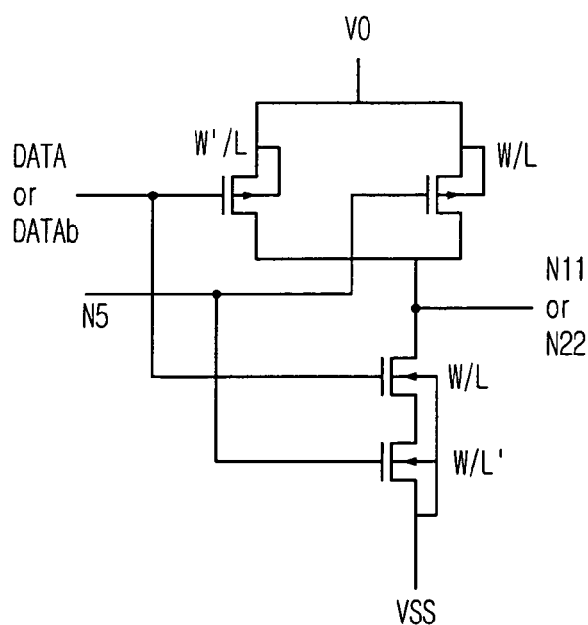
FIG. 3B depicts the construction of a NAND gate in accordance with the present invention.
Figure 3C:
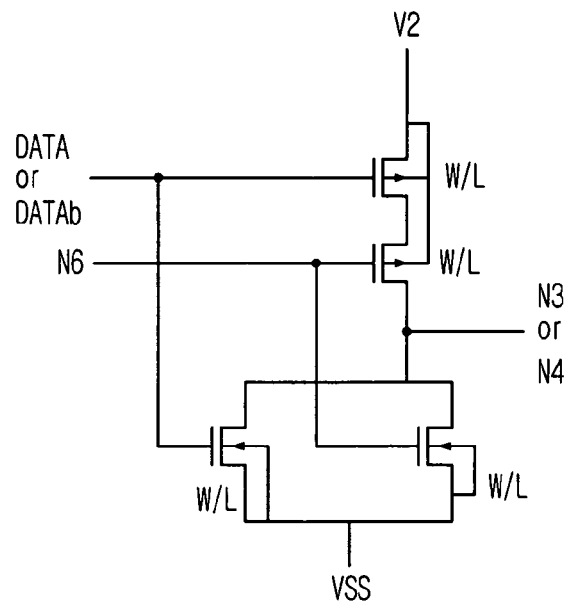
FIG. 3C represents the construction of a conventional NOR gate included in the circuit in FIG. 1.
Figure 3D:
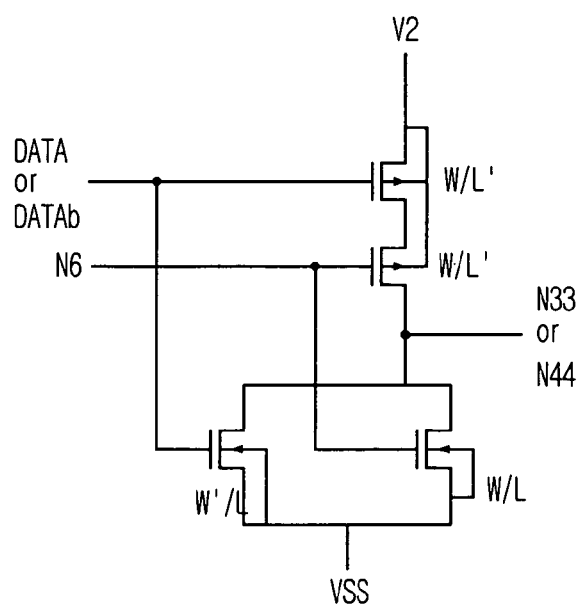
FIG. 3D describes the construction of a NOR gate in accordance with the present invention.

Referring to FIGS. 3A to 3D, the preferred embodiments of the present invention are shown in comparison with the conventional technology. FIGS. 3A and 3C provide representative circuits of the conventional NAND and NOR gates, respectively. FIGS. 3B and 3D show the NAND and NOR gates in accordance with the present invention.

Figure 1:
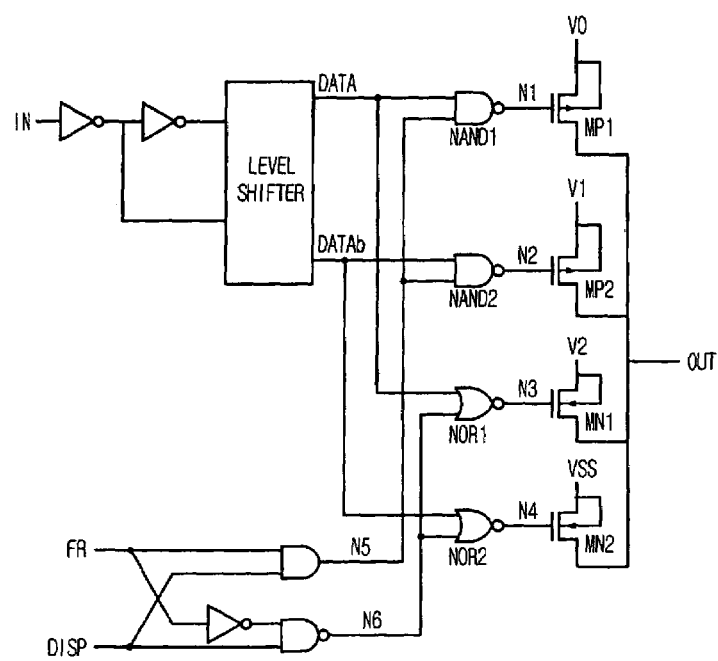
FIG. 1 provides a circuit diagram of a conventional multi-level voltage output control circuit used in a flat panel display driving circuit.

The logic gates described in FIGS. 3B and 3D are necessarily required in a multi-level voltage output control circuit in accordance with the present invention and are used for driving MOS switching devices which select one of the multi-level voltages in the conventional multi-level voltage output control circuit described in FIG. 1.

The circuits in FIGS. 3B and 3D are structurally identical to those in FIGS. 3A and 3C, respectively. But, there is a difference in the constitution of MOS transistors constructing the logic gates. Therefore, there is no difference in the apparent construction of the circuits. In accordance with the present invention, a threshold voltage $V_T$ of the MOS transistor is raised or lowered by modulating a channel width W or a channel length L of the MOS transistor.

In FIGS. 3B and 3D, W' and L' are larger than W and L, respectively.

In general, when deciding the size of a drain channel and a source channel of the MOS transistor, the performance of the MOS transistor is varied according to how the channel width W and the channel length L are determined or how a ratio of the channel length to the channel width (W/L) is decided.

As effects of changing the performance of the MOS transistor, there is a channel size modulation effect, a short channel effect, a narrow width effect, a hot carrier effect and so on.

According to the channel size modulation effect, as the channel length L of the MOS transistor becomes shorter, the threshold voltage $V_T$ of the MOS transistor goes down. Meanwhile, as the channel width W becomes narrower, its threshold voltage $V_T$ goes up.

Furthermore, an opposite phenomenon can occur in a specific region. That is, since the threshold voltage $V_T$ is lowered when the channel width W of the MOS transistor becomes wider and, thus, a trigger happens at a low voltage, it is possible to get an effect of advancing somewhat the turn-on time of the MOS transistor by widening the channel width W. On the other hand, since the threshold voltage $V_T$ is raised when the channel length L of the MOS transistor becomes longer and, thus, the trigger happens at a high voltage, it is possible to get an effect of slowing down somewhat the turn-off time of the MOS transistor by lengthening the channel length L.

The circuits in FIGS. 3B and 3D are formed by utilizing the performance of the MOS transistor explained above and respectively show a NAND gate and a NOR gate constructed with MOS transistors whose performance is changed according to the purpose of the present invention.

Referring to FIG. 3B, there is explained in detail the construction of a NAND gate in accordance with the present invention.

In the PMOS transistors which change output signals N11 and N22 to a high state by outputting a voltage of a supply voltage terminal when one of the input signal DATA (DATAb) and the N5 signal has a low state, the turn-on timing is advanced by widening somewhat the channel width (W→W') of at least one of PMOS transistors than a normal size, thereby advancing a rising timing of the output signals N11 and N22.

In the NMOS transistors which change the output signals N11 and N22 to a low state by outputting the voltages of the output signals N11 and N22 to the ground voltage VSS when both of the input signal DATA (DATAb) and the N5 signal are in a high state, the turn-on timing is slowed down by lengthening the channel length (L→L') of the NMOS transistors than a normal size, thereby slowing down a falling timing of the output signals N11 and N22.

Figure 4:
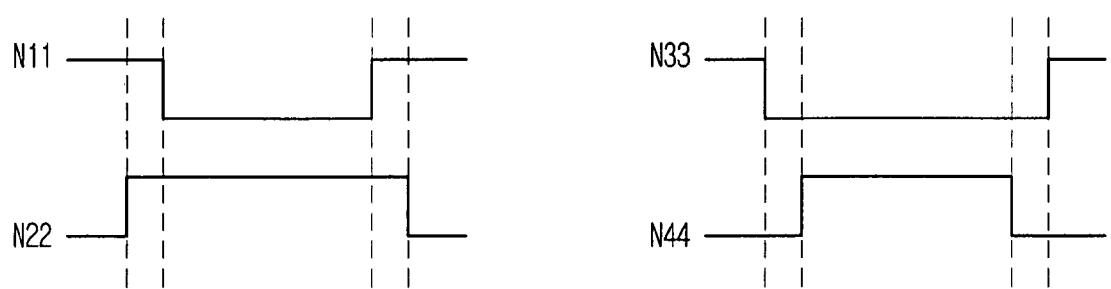
FIG. 4 is a timing diagram showing the performance of output signals of gates in FIGS. 3B and 3D.

As a result, the output signals N11 and N22 become to have the performance shown in FIG. 4. That is to say, the rising timing of the output signals N11 and N22 is advanced and their falling timing is slowed down, having asymmetric performance. Therefore, there does not occur a case in which the output signals N11 and N22 have a low state at the same time.

Referring to FIG. 3D, there is described in detail the construction of a NOR gate in accordance with the present invention.

In the PMOS transistors which change output signals N33 and N44 to a high state by outputting a voltage of the supply voltage terminal when both of the input signal DATA (DATAb) and an N6 signal are in a low state, the turn-on timing is slowed down by lengthening somewhat the channel length (L→L') of the PMOS transistors than a normal size, thereby slowing down a rising timing of the output signals N33 and N44.

In the NMOS transistors which change output signals N33 and N44 to a low state by outputting the voltage of the output signals N33 and N44 to the ground voltage VSS when one of the input signal DATA (DATAb) and the N6 signal is in a high state, the turn-on timing is advanced by widening the channel width (W→W') of at least one NMOS transistor than a normal size, thereby advancing a falling timing of the output signals N33 and N44.

As a result, the output signals N33 and N44 become to have the performance shown in FIG. 4. Namely, the rising timing of the output signals N33 and N44 is slowed down and their falling timing is advanced, having asymmetric performance. Therefore, there does not occur a case in which the output signals N33 and N44 have a high state at the same time.

By constructing the NAND gate and the NOR gate as described above, it is possible to remove a case in which the switching transistors MP1 and MP2 are turned on at the same time and the switching transistors MN1 and MN2 are turned-on simultaneously.

Figure 5:
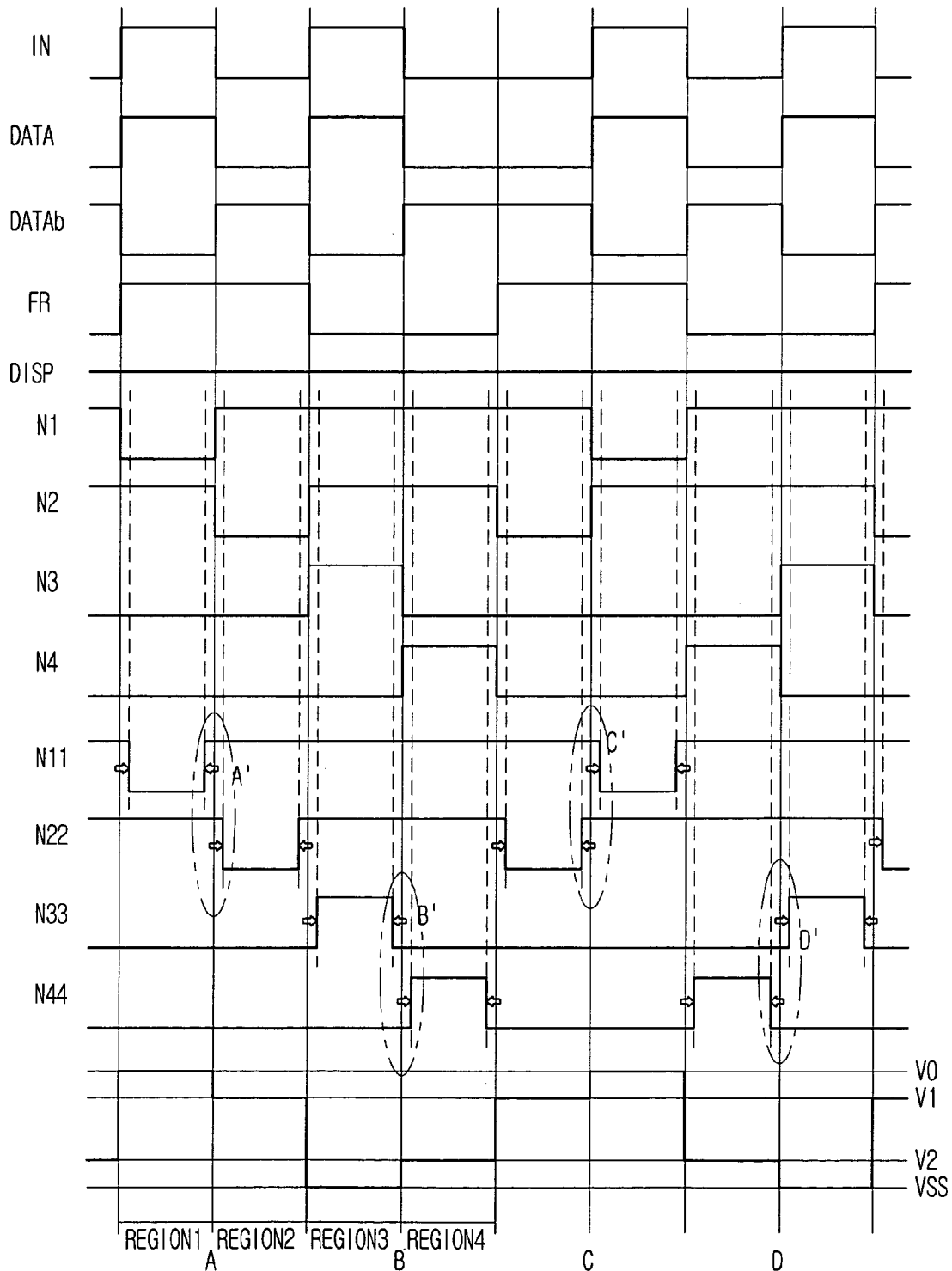
FIG. 5 represents a timing diagram of signals at nodes of the circuit in FIG. 1 using the NAND gate and the NOR gate in accordance with the present invention and the timing diagram of FIG. 2 for comparison.

In FIG. 5, there is provided a timing diagram of signals generated at a case of driving the switching devices by producing gate signals shown in FIG. 4 with the construction of FIGS. 3B and 3D.

Figure 2:
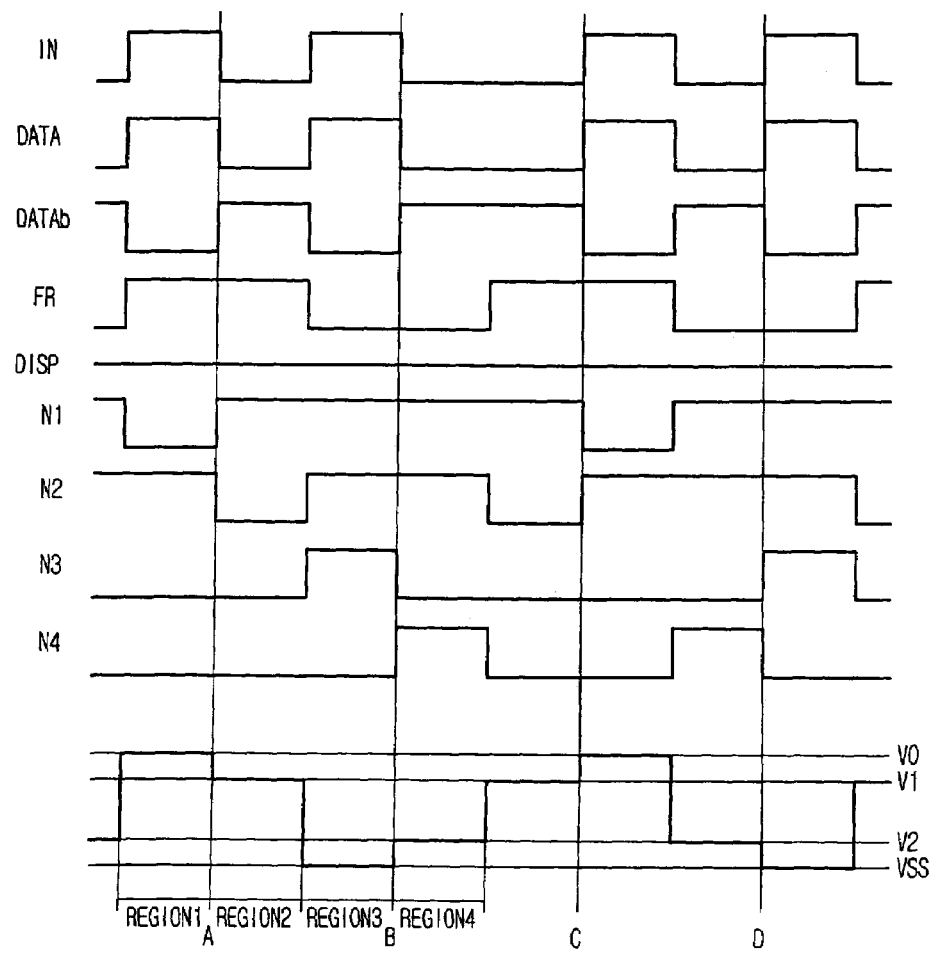
FIG. 2 illustrates a timing diagram of signals at nodes of the circuit in FIG. 1 consisting of conventional NAND gates and NOR gate.

When comparing points A', B', C' and D' in FIG. 5 with the points A, B, C and D in FIG. 2, it is noticed that the penetration current flowing from V0 to V1 or from V2 to VSS is removed by excluding the overlapping phenomenon of complementary input signals.

For instance, although it is preferable that the NAND gate and the NOR gate in accordance with the present invention are used in the multi-level voltage output control circuit, they can be used in any circuit which generates control signals for controlling two different switching devices based on complementary input signals.

Moreover, in the structure of the NAND gate and the NOR gate in accordance with the present invention, it is not required to change the features of the PMOS transistor and the NMOS transistor. The similar effect can be obtained by changing the feature of at least one of the PMOS transistor and the NMOS transistor. Therefore, the scope of the present invention is not limited to the embodiments described in the drawings.

In accordance with the present invention, it is possible to remove the penetration current which may be generated at a driver of the multi-level voltage output terminal and, thus, the reduction of the power consumption and the output performance can be maximized. This can be effectively applied to a circuit for driving a display like a portable communication system using low power.

The present application contains subject matter related to the Koran patent application NO. KR 2004-0022315, filed in the Korean Patent Office on Mar. 31, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A multi-level voltage output control circuit for selectively outputting one of multi-level power voltages by driving gates of two PMOS transistors, which act as switching devices for the multi-level power voltages, with two output signals, wherein the two output signals have complementary phases to each other and generated from two NAND gates coupled with two input signals which have an identical timing and complementary phases to each other, which comprises:

the two NAND gates for advancing a rising timing and slowing down a falling timing of each two output signals, thereby excluding a case in which the two output signals are in a same logic state at the same time, by selectively modulating sizes of PMOS transistors and NMOS transistors constructing the two NAND gates, wherein each of the PMOS transistors has a different width.

2. The multi-level voltage output control circuit as recited in claim 1, wherein one of said PMOS transistors included in the NAND gate has a threshold voltage $V_T$ lowered by modulating a channel width W or a channel length L of the PMOS transistor.

3. The multi-level voltage output control circuit as recited in claim 2, wherein the channel width W of the PMOS transistor is widened to lower the threshold voltage $V_T$.

4. The multi-level voltage output control circuit as recited in claims 1, wherein at least one NMOS transistor included in the NAND gate has the threshold voltage $V_T$ raised by adjusting a channel width W or a channel length L of the NMOS transistor.

5. The multi-level voltage output control circuit as recited in claims 2, wherein at least one NMOS transistor included in the NAND gate has the threshold voltage $V_T$ raised by adjusting a channel width W or a channel length L of the NMOS transistor.

6. The multi-level voltage output control circuit as recited in claims 3, wherein at least one NMOS transistor included in the NAND gate has the threshold voltage $V_T$ raised by adjusting a channel width W or a channel length L of the NMOS transistor.

7. The multi-level voltage output control circuit as recited in claim 4, wherein the channel length L of the NMOS transistor is lengthened to lower the threshold voltage $V_T$.

8. The multi-level voltage output control circuit as recited in claim 5, wherein the channel length L of the NMOS transistor is lengthened to lower the threshold voltage $V_T$.

9. The multi-level voltage output control circuit as recited in claim 6, wherein the channel length L of the NMOS transistor is lengthened to lower the threshold voltage $V_T$.

10. A multi-level voltage output control circuit for selectively outputting one of multi-level power voltages by driving gates of two NMOS transistors, which act as switching devices for the multi-level power voltages, with two output signals, wherein the two output signals have complementary phases to each other and generated from two NOR gates coupled with two input signals which have an identical timing and complementary phases to each other, which comprises:

the two NOR gates for slowing down a rising timing and advancing a falling timing of each two output signals, thereby excluding a case in which the two output signals are in a same logic state at the same time, by selectively modulating sizes of PMOS transistors and NMOS transistors constructing the two NOR gates, wherein each of the NMOS transistors has a different length.

11. The multi-level voltage output control circuit as recited in claim 10, wherein at least one PMOS transistor included in the NOR gate has a threshold voltage $V_T$ raised by modulating a channel width W or a channel length L of the PMOS transistor.

12. The multi-level voltage output control circuit as recited in claim 11, wherein the channel length L of the PMOS transistor is lengthened to raise the threshold voltage $V_T$.

13. The multi-level voltage output control circuit as recited in claim 10, wherein one of the NMOS transistors included in the NOR gate has the threshold voltage $V_T$ lowered by adjusting a channel width W or a channel length L of the NMOS transistor.

14. The multi-level voltage output control circuit as recited in claim 11, wherein one of the NMOS transistors included in the NOR gate has the threshold voltage $V_T$ lowered by adjusting a channel width W or a channel length L of the NMOS transistor.

15. The multi-level voltage output control circuit as recited in claim 12, wherein one of the NMOS transistors included in the NOR gate has the threshold voltage $V_T$ lowered by adjusting a channel width W or a channel length L of the NMOS transistor.

16. The multi-level voltage output control circuit as recited in claim 13, wherein the channel width W of the NMOS transistor is widened to lower the threshold voltage $V_T$.

17. The multi-level voltage output control circuit as recited in claim 14, wherein the channel width W of the NMOS transistor is widened to lower the threshold voltage $V_T$.

18. The multi-level voltage output control circuit as recited in claim 15, wherein the channel width W of the NMOS transistor is widened to lower the threshold voltage $V_T$.

19. A NAND gate circuit for a multi-level voltage output control circuit including a first NAND gate receiving a first signal and a second NAND gate receiving a second signal which has an identical timing and a complementary phase to the first signal, thereby generating two output signals which have complementary phases to each other, wherein, for each of the first and the second NAND gates, one of PMOS transistors constituting the NAND gate has a channel width W relatively larger than a channel length L and NMOS transistors constructing the NAND gate have a channel length L relatively larger than a channel width W.

20. A NOR gate circuit for a multi-level voltage output control circuit including a first NOR gate receiving a first signal and a second NOR gate receiving a second signal which has an identical timing and a complementary phase to the first signal, thereby producing two output signals which have complementary phases to each other, wherein, for each of the first and the second NOR gates, PMOS transistors constituting the NOR gate have a channel width W relatively shorter than a channel length L and one of said NMOS transistors constructing the NOR gate has a channel length L relatively shorter than a channel width W.

* * * * *